United States Patent
Lee et al.

(10) Patent No.: US 9,099,304 B2
(45) Date of Patent: Aug. 4, 2015

(54) SEMICONDUCTOR DEVICE AND METHOD OF FABRICATING THE SAME

(71) Applicant: Samsung Electronics Co., Ltd., Suwon-si (KR)

(72) Inventors: Dong-soo Lee, Gunpo-si (KR); Eui-chul Hwang, Seongnam-si (KR); Seong-ho Cho, Gwacheon-si (KR); Myoung-jae Lee, Hwaseong-si (KR); Sang-moon Lee, Yongin-si (KR); Sung-hun Lee, Yongin-si (KR); Mohammad Rakib Uddin, Hwaseong-si (KR); David Seo, Yongin-si (KR); Moon-seung Yang, Hwaseong-si (KR); Ji-hyun Hur, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/211,789

(22) Filed: Mar. 14, 2014

(65) Prior Publication Data

US 2015/0028458 A1    Jan. 29, 2015

(30) Foreign Application Priority Data

Jul. 29, 2013    (KR) .......................... 10-2013-0089832

(51) Int. Cl.
| | |
|---|---|
| *H01L 21/318* | (2006.01) |
| *H01L 21/02* | (2006.01) |
| *H01L 29/20* | (2006.01) |
| *H01L 21/28* | (2006.01) |
| *H01L 29/51* | (2006.01) |
| *H01L 29/66* | (2006.01) |
| *H01L 29/78* | (2006.01) |
| *H01L 29/49* | (2006.01) |

(52) U.S. Cl.
CPC ...... *H01L 21/02362* (2013.01); *H01L 21/0226* (2013.01); *H01L 21/28264* (2013.01); *H01L 29/20* (2013.01); *H01L 29/513* (2013.01); *H01L 29/518* (2013.01); *H01L 29/66522* (2013.01); *H01L 29/495* (2013.01); *H01L 29/785* (2013.01)

(58) Field of Classification Search
CPC ................... H01L 21/02038; H01L 21/02247
USPC ................... 148/33.3; 438/46, 763, 767, 779
See application file for complete search history.

(56) References Cited

U.S. PATENT DOCUMENTS

| | | | |
|---|---|---|---|
| 5,147,827 A * | 9/1992 | Chino et al. ................... | 438/767 |
| 6,483,172 B1 * | 11/2002 | Cote et al. ...................... | 257/639 |
| 6,798,050 B1 | 9/2004 | Homma et al. | |
| 7,084,056 B2 | 8/2006 | Won | |
| 7,504,700 B2 | 3/2009 | Zhu et al. | |
| 7,763,317 B2 | 7/2010 | Blackwell et al. | |
| 8,344,418 B2 | 1/2013 | Rachmady et al. | |
| 8,415,772 B2 | 4/2013 | de Souza et al. | |
| 2004/0238955 A1 | 12/2004 | Homma et al. | |
| 2005/0001318 A1 | 1/2005 | Won | |
| 2006/0255463 A1 | 11/2006 | Won | |
| 2008/0261379 A1 * | 10/2008 | Jinbo et al. ..................... | 438/458 |

(Continued)

*Primary Examiner* — George Fourson, III
(74) *Attorney, Agent, or Firm* — Onello & Mello, LLP.

(57) ABSTRACT

A semiconductor device is provided that includes a diffusion barrier layer between a compound semiconductor layer and a dielectric layer, as well as a method of fabricating the semiconductor device, such that the semiconductor device includes a compound semiconductor layer; a dielectric layer; and a diffusion barrier layer including an oxynitride formed between the compound semiconductor layer and the dielectric layer.

18 Claims, 3 Drawing Sheets

(56) References Cited

U.S. PATENT DOCUMENTS

| | | | |
|---|---|---|---|
| 2009/0014799 A1* | 1/2009 | Isobe | 257/351 |
| 2011/0114992 A1* | 5/2011 | Schmid et al. | 257/100 |
| 2012/0292768 A1* | 11/2012 | Chang et al. | 257/751 |
| 2013/0270562 A1* | 10/2013 | Yamazaki | 257/57 |
| 2013/0288426 A1* | 10/2013 | Akimoto | 438/104 |
| 2014/0198816 A1* | 7/2014 | Margalit et al. | 372/45.01 |
| 2014/0326994 A1* | 11/2014 | Tanaka | 257/43 |
| 2014/0361291 A1* | 12/2014 | Sasagawa et al. | 257/43 |

\* cited by examiner

SEMICONDUCTOR DEVICE AND METHOD OF FABRICATING THE SAME

CROSS-REFERENCE TO RELATED APPLICATIONS

This application claims the benefit of Korean Patent Application No. 10-2013-0089832, filed on Jul. 29, 2013, in the Korean Intellectual Property Office, the disclosure of which is incorporated herein in its entirety by reference.

BACKGROUND

1. Field

The present disclosure relates to a semiconductor device and a method of fabricating the semiconductor device, and more particularly, to a semiconductor device including a diffusion barrier layer between a III-V compound semiconductor layer and a dielectric layer, and a method of fabricating the semiconductor device.

2. Description of the Related Art

Compound semiconductors have two or more elements and exhibit semiconductor characteristics. For example, a GaAs compound semiconductor includes gallium (Ga) and arsenic (As), which are elements of groups III and V, respectively, in the periodic table. Semiconductor devices including III-V compound semiconductors such as GaAS may be operated at a relatively high speed because the electron mobility thereof is five or more times faster than that of semiconductor devices including silicon semiconductors. In addition, since semiconductor devices including III-V compound semiconductors can be stably operated at high temperatures, such semiconductor devices may be used in high-power devices. Furthermore, since semiconductor devices including III-V compound semiconductors can be operated in high frequency bands, such semiconductor devices may be used as millimeter-wave or microwave devices or photoelectric devices. In addition, since III-V compound semiconductors can emit light having a wavelength within the range from the infrared region to the visible light region, such III-V compound semiconductors can be included in light-emitting diodes (LEDs) or semiconductor lasers capable of emitting various colors of light. Furthermore, III-V compound semiconductors consume less power than other semiconductors.

III-V compound semiconductors may have various characteristics according to the kinds and compositions of substances added thereto. However, a common characteristic of group III-V compound semiconductors is that they are relatively more easily oxidized in comparison with silicon semiconductors. For example, the surface of a group III-V compound semiconductor making contact with an oxide layer may thereby be oxidized with a resulting undesirable increase in surface roughness and in various physical/electrical defects.

SUMMARY

The present invention provides a semiconductor device including a diffusion barrier layer between a III-V compound semiconductor layer and a dielectric layer, and a method of fabricating the semiconductor device.

Additional aspects will be set forth in part in the description which follows and, in part, will be apparent from the description, or may be learned by practice of the presented embodiments.

According to an aspect of the present invention, a semiconductor device includes: a compound semiconductor layer; a dielectric layer above the compound semiconductor layer; and a diffusion barrier layer including an oxynitride and formed between the compound semiconductor layer and the dielectric layer.

As used herein, the term "compound semiconductor layer" refers to a semiconductor layer that includes at least two elements, at least one of those elements selected from elements in groups III and V, or in some embodiments, group VI in the periodic table.

The diffusion barrier layer may include an oxynitride such as at least one of $HfON_x$, $SiON_x$, $AlON_x$, $TiSiON_x$, $TaSiON_x$, $HfSiO_xN_y$, and $M_xO_yN_z$ where M denotes a transition metal or rare-earth metal.

The diffusion barrier layer may have a thickness of about 10 nm or less.

The dielectric layer may include at least one of $HfO_2$, $Al_2O_3$, $La_2O_3$, $ZrO_2$, HfSiO, HfSiON, HfLaO, LaAlO, and SrTiO.

The semiconductor device may further include a passivation layer between the compound semiconductor layer and the diffusion barrier layer.

The passivation layer may include at least one of sulfur (S), nitrogen (N), fluorine (F), chlorine (Cl), and hydrogen (H) formed on the compound semiconductor layer.

The diffusion barrier layer may further include a nitride such as at least one of silicon nitride (SiN), aluminum nitride (AlN), and hafnium nitride (HfN) formed on the compound semiconductor layer.

The diffusion barrier layer may further include a nitride layer formed on the compound semiconductor layer by nitriding a surface of the compound semiconductor layer.

The diffusion barrier layer and the dielectric layer may comprise the same material.

The diffusion barrier layer and the dielectric layer may include at least one of $HfO_xN_y$ and $HfSiO_xN_y$.

According to another aspect of the present invention, there is provided a method of fabricating a semiconductor device, the method including: forming a diffusion barrier layer including an oxynitride on a compound semiconductor layer; and forming a dielectric layer on the diffusion barrier layer.

The diffusion barrier layer may be formed by an ALD (atomic layer deposition) method, by a CVD (chemical vapor deposition) method, and/or by a sputtering method.

The diffusion barrier layer may further include, for example, at least one of SiN, AlN, and HfN, and after the forming of the dielectric layer, the method may further include performing a thermal annealing treatment.

Prior to the forming the diffusion barrier layer, the method may include forming a passivation layer on the compound semiconductor layer.

Embodiments of this invention include the following:

1. A semiconductor device comprising: a compound semiconductor layer; a dielectric layer; and a diffusion barrier layer comprising an oxynitride layer formed between the compound semiconductor layer and the dielectric layer.

2. The semiconductor device of paragraph 1 above, wherein the compound semiconductor layer comprises at least one element of groups III, V, and VI in the periodic table.

3. The semiconductor device of paragraph 1 above, wherein the diffusion barrier layer comprises at least one of $HfON_x$, $SiON_x$, $AlON_x$, $TiSiON_x$, $TaSiON_x$, $HfSiO_xN_y$, and $M_xO_yN_z$, where M denotes a transition metal or rare-earth metal.

4. The semiconductor device of paragraph 1 above, wherein the diffusion barrier layer has a thickness of about 10 nm or less.

5. The semiconductor device of paragraph 1 above, wherein the dielectric layer comprises at least one of $HfO_2$, $Al_2O_3$, $La_2O_3$, $ZrO_2$, HfSiO, HfSiON, HfLaO, LaAlO, and SrTiO.

6. The semiconductor device of paragraph 1 above, further comprising a passivation layer between the compound semiconductor layer and the diffusion barrier layer.

7. The semiconductor device of paragraph 6 above, wherein the passivation layer comprises at least one of sulfur (S), nitrogen (N), fluorine (F), chlorine (Cl), and hydrogen (H) formed on the compound semiconductor layer.

8. The semiconductor device of paragraph 1 above, wherein the diffusion barrier layer further comprises at least one of silicon nitride (SiN), aluminum nitride (AlN), and hafnium nitride (HfN) formed on the compound semiconductor layer.

9. The semiconductor device of paragraph 1 above, wherein the diffusion barrier layer further comprises a nitride layer formed on the compound semiconductor layer by nitriding a surface of the compound semiconductor layer.

10. The semiconductor device of paragraph 1 above, wherein the diffusion barrier layer and the dielectric layer comprise the same material.

11. The semiconductor device of paragraph 10 above, wherein the diffusion barrier layer and the dielectric layer comprise at least one of $HfO_xN_y$ and $HfSiO_xN_y$.

12. A method of fabricating a semiconductor device, the method comprising: forming a diffusion barrier layer comprising an oxynitride on a compound semiconductor layer; and forming a dielectric layer on the diffusion barrier layer.

13. The method of paragraph 12 above, wherein the compound semiconductor layer comprises at least one element of groups III, V, and VI in the periodic table.

14. The method of paragraph 12 above, wherein the diffusion barrier layer comprises at least one of $HfON_x$, $SiON_x$, $AlON_x$, $TiSiON_x$, $TaSiON_x$, $HfSiO_xN_y$, and $M_xO_yN_z$, where M denotes a transition metal or rare-earth metal.

15. The method of paragraph 14 above, wherein the diffusion barrier layer is formed by an ALD (atomic layer deposition) method, a CVD (chemical vapor deposition) method, and/or a sputtering method.

16. The method of paragraph 12 above, wherein the diffusion barrier layer further comprises at least one of SiN, AlN, and HfN, and after the step of forming of the dielectric layer, the method further comprises a step of performing a thermal annealing treatment.

17. The method of paragraph 12 above, wherein the diffusion barrier layer further comprises a nitride layer formed on the compound semiconductor layer by nitriding a surface of the compound semiconductor layer.

18. The method of paragraph 12 above, wherein prior to the step of forming the diffusion barrier layer, the method comprises a step of forming a passivation layer on the compound semiconductor layer.

19. The method of paragraph 18 above, wherein the passivation layer comprises at least one of sulfur (S), nitrogen (N), fluorine (F), chlorine (Cl), and hydrogen (H) formed on the compound semiconductor layer.

20. The method of paragraph 12 above, wherein the diffusion barrier layer and the dielectric layer comprise the same material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
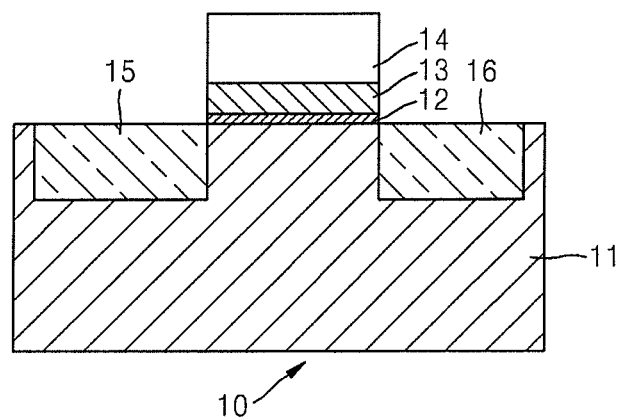
FIG. 1 is a schematic cross-sectional view illustrating a semiconductor device according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items or steps. Expressions such as "at least one of," when preceding a list of elements, modify the entire list of elements and do not modify the individual elements of the list.

Hereinafter, a semiconductor device and a method of fabricating the semiconductor device will be described with reference to the accompanying drawings. In the drawings, the size of each component may be exaggerated for clarity of illustration. The following embodiments are exemplary examples, and various changes in form and details may be made therein. It will also be understood that when a layer is referred to as being "above" or "on" another layer or substrate, it may be directly on the other layer or substrate or be above the layer or substrate without making contact with the layer or substrate. It will also be understood that the terms "above" and "on" are relative terms based on the orientation of a semiconductor device as depicted in the accompanying drawings. If the semiconductor device were oriented differently, the appropriate terminology for describing the relative positioning of the several component layers would change accordingly—for example, with a 180° rotation, "above" would become "below"—but otherwise the structure of the device and the method of fabricating the device would remain the same as described herein.

FIG. 1 is a schematic cross-sectional view illustrating a semiconductor device 10 according to an embodiment. Referring to FIG. 1, the semiconductor device 10 of the FIG. 1 embodiment may include a compound semiconductor layer 11, a dielectric layer 13 disposed above the compound semiconductor layer 11, and a diffusion barrier layer 12 disposed between the compound semiconductor layer 11 and the dielectric layer 13. In the FIG. 1 embodiment, the semiconductor device 10 may further include: source/drain regions 15 and 16 formed by doping upper portions of the compound semiconductor layer 11 located at the sides of the dielectric layer 13; and an electrode 14 disposed on the dielectric layer 13. For example, the electrode 14 may be a gate electrode.

For example, the semiconductor device 10 illustrated in FIG. 1 may be a metal oxide semiconductor field-effect transistor (MOSFET). A MOSFET is an example of the semiconductor device 10. The semiconductor device 10 of the FIG. 1 embodiment is not limited thereto. For example, the semiconductor device 10 may be applied to various other devices such as a transistor, a capacitor, a light emitting device, an optical sensor, a modulator, a solar cell, and an integrated circuit in which an interface is formed between the dielectric layer 13 and the compound semiconductor layer 11. In FIG. 1, the electrode 14 is disposed on the dielectric layer 13. However, the FIG. 1 embodiment is not limited to that type of semiconductor device. That is, instead of the electrode 14, another layer may be disposed on the dielectric layer 13 according to the type or structure of the semiconductor device 10.

For example, the compound semiconductor layer 11 may include a group III element such as gallium (Ga) and indium (In), a group V element such as arsenic (As) and phosphorus (P), or a chalcogenide including a group VI element. For example, the compound semiconductor layer 11 may include GaN, GaAs, InGaAs, or InP. The dielectric layer 13 may include silicon dioxide ($SiO_2$). However, the dielectric layer 13 may also include a dielectric material having a high dielectric constant (High-k) for guaranteeing sufficient electrostatic capacity and thickness. For example, the dielectric layer 13 may include a high-k metal oxide dielectric material such as $HfO_2$, $Al_2O_3$, $La_2O_3$, $ZrO_2$, HfSiO, HfSiON, HfLaO, LaAlO, and SrTiO.

The electrode 14 disposed on the dielectric layer 13 may include a metal such as platinum (Pt). The source/drain regions 15 and 16 may be formed by doping upper portions of the compound semiconductor layer 11 close to the sides of the dielectric layer 13. For example, if the compound semiconductor layer 11 is doped with an n-type impurity, the source/drain regions 15 and 16 may be doped with a p-type impurity, and if the compound semiconductor layer 11 is doped with a p-type impurity, the source/drain regions 15 and 16 may be doped with an n-type impurity.

Since the compound semiconductor layer 11 is thermally unstable and easy to oxidize, if the dielectric layer 13 and the compound semiconductor layer 11 make contact with each other, interfacial characteristics thereof may be poor. For example, while the dielectric layer 13 is being formed on the compound semiconductor layer 11, the surface of the compound semiconductor layer 11 may oxidize. Due to high-temperature environments in subsequent fabrication steps, elements of the compound semiconductor layer 11 may diffuse into the dielectric layer 13. For example, if the compound semiconductor layer 11 includes GaAs, GaAs on the surface of the compound semiconductor layer 11 may react with oxygen to form gallium oxide ($Ga_2O_3$) and also separate As in the form of ions or elemental As. In a subsequent high-temperature process, the separated As may diffuse into the dielectric layer 13 to deteriorate the dielectric characteristics of the dielectric layer 13. As a result, if compound semiconductor layer 11 and dielectric layer 13 are in direct contact, crystal defects may be formed at the interface between the compound semiconductor layer 11 and the dielectric layer 13, resulting in current leakage and decreased electron mobility.

In the FIG. 1 embodiment, however, the diffusion barrier layer 12 may be disposed between the dielectric layer 13 and the compound semiconductor layer 11 to prevent direct contact therebetween. For example, the diffusion barrier layer 12 may include an oxynitride. In general, oxynitrides have good interfacial characteristics, thermal stability, and dense film quality. Therefore, the diffusion barrier layer 12 may block oxygen to prevent oxidation of the compound semiconductor layer 11 and may suppress diffusion of elements between the compound semiconductor layer 11 and the dielectric layer 13. Furthermore, since oxynitrides have a relatively high dielectric constant, the characteristics of the dielectric layer 13 having a high dielectric constant may not be affected by the diffusion barrier layer 12. In this aspect, the diffusion barrier layer 12 may be considered as a part of the dielectric layer 13. That is, the dielectric layer 13 may be considered as having a double layer structure formed by a diffusion barrier material and a high-k material.

The diffusion barrier layer 12 may include an oxynitride such as $HfON_x$, $SiON_x$, $AlON_x$, $TiSiON_x$, $TaSiON_x$, $HfSiO_xN_y$, and $M_xO_yN_z$ (where M refers to a transition metal or rare-earth metal). The composition of the oxynitride and the thickness of the diffusion barrier layer 12 may be varied according to any of the following: the process conditions of the subsequent fabrication steps (such as a heat treatment process); the material, material composition, and/or crystal surface state of the compound semiconductor layer 11; the material and material composition of the dielectric layer 13, etc. For example, the diffusion barrier layer 12 may include $M_xO_yN_z$ where $0 \leq x \leq 5$, $0 \leq y \leq 5$, and $0 \leq z \leq 5$. Since the diffusion barrier layer 12 may function as a dielectric material, the diffusion barrier layer 12 may have a high dielectric constant so as not to affect the characteristics of the dielectric layer 13. The diffusion barrier layer 12 may have a thickness of about 10 nm or less. For example, the diffusion barrier layer 12 may be formed on the compound semiconductor layer 11 by a method such as an atomic layer deposition (ALD) method, a chemical vapor deposition (CVD) method, and/or a sputtering method.

For example, a nitride layer including silicon nitride (SiN), aluminum nitride (AlN), or hafnium nitride (HfN) may first be formed on the compound semiconductor layer 11, and the dielectric layer 13 may then be formed on the nitride layer. Thereafter, a heat treatment (thermal annealing) may be performed on the structure. The process temperature of the heat treatment may be varied according to dielectric material characteristics and interfacial states. For example, the process temperature of the heat treatment may be about 800° C. or lower. During this heat treatment, nitrogen of the nitride layer and oxygen of the dielectric layer 13 may form an oxynitride layer as the diffusion barrier layer 12 between compound semiconductor layer 11 and dielectric layer 13. After the heat treatment, a portion of the nitride layer may remain between the compound semiconductor layer 11 and the diffusion barrier layer 12.

Figure 2:
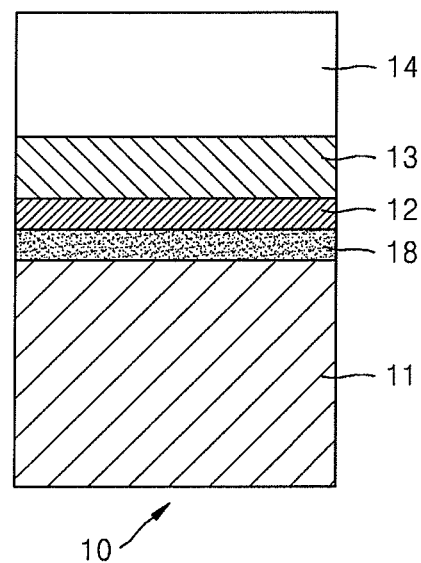
FIG. 2 is a schematic cross-sectional view illustrating an interfacial portion between a compound semiconductor layer and a dielectric layer of a compound semiconductor device according to another embodiment.

FIG. 2 is a schematic cross-sectional view illustrating an interfacial portion between a compound semiconductor layer 11 and a dielectric layer 13 of a compound semiconductor device 10 according to another embodiment. Referring to FIG. 2, a passivation layer 18, a diffusion barrier layer 12, a dielectric layer 13, and an electrode 14 may be sequentially formed on the compound semiconductor layer 11. The compound semiconductor device 10 of the FIG. 2 embodiment may further include the passivation layer 18 between the compound semiconductor layer 11 and the diffusion barrier layer 12, as thus differs from the compound semiconductor device 10 illustrated in FIG. 1.

The passivation layer 18 may be formed by replacing a group III or V element included in the surface of the compound semiconductor layer 11 with sulfur (S), nitrogen (N), fluorine (F), chlorine (Cl), or hydrogen (H). That is, the passivation layer 18 may be formed by coating the surface of the compound semiconductor layer 11 with a thin layer of sulfur (S), nitrogen (N), fluorine (F), chlorine (Cl), or hydrogen (H). Since the passivation layer 18 is bonded to the surface of the compound semiconductor layer 11, a gap state caused by defects, such as vacancies or dangling bonds, may be suppressed owing to high bonding energy of the passivation layer 18. However, the passivation layer 18 is generally vulnerable to high temperature. The diffusion barrier layer 12 formed on the passivation layer 18 may compensate for the lower thermal stability of the passivation layer 18. Therefore, the combination of the passivation layer 18 and the diffusion barrier layer 12 may be effective to suppress oxidation of the compound semiconductor layer 11 and also to suppress diffusion between the compound semiconductor layer 11 and the dielectric layer 13.

Figure 3:
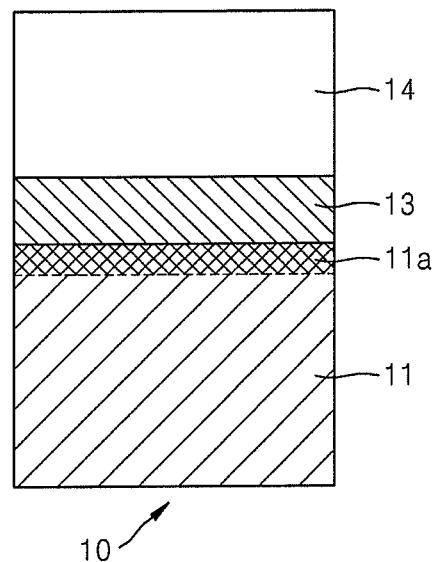
FIG. 3 is a schematic cross-sectional view illustrating an interfacial portion between a compound semiconductor layer and a dielectric layer of a compound semiconductor device according to another embodiment.

FIG. 3 is a schematic cross-sectional view illustrating an interfacial portion between a compound semiconductor layer 11 and a dielectric layer 13 of a compound semiconductor device 10 according to another embodiment. Referring to FIG. 3, instead of directly forming a diffusion barrier layer, a nitride layer 11a may be formed on the surface of the compound semiconductor layer 11 by nitriding the surface of the compound semiconductor layer 11. For example, if the compound semiconductor layer 11 includes InGaAs, the nitride layer 11a formed on the surface of the compound semiconductor layer 11 may be an N-InGaAs layer. For example, the nitride layer 11a may be formed by heating the compound semiconductor layer 11 in an ammonia atmosphere. In addition to the ammonia-atmosphere heat treatment, a plasma treatment may also be used to effect the nitriding step.

When the dielectric layer 13 is subsequently formed on the nitride layer 11a, the nitride layer 11a may react with oxygen in the dielectric layer 13, for example with a metal oxide, to form an oxynitride on a surface of the nitride layer 11a, and that oxynitride may function as the diffusion barrier layer 12 of this and other embodiments. Although the nitride layer 11a shown in FIG. 3 may be used as described above to form a diffusion barrier layer, alternatively a diffusion barrier layer may be additionally formed on the nitride layer 11a. The nitride layer 11a may also be used (formed) together with a passivation layer (such as the passivation layer 18 in FIG. 2).

If the dielectric layer 13 including an oxynitride has characteristics of a diffusion barrier layer and a sufficiently high dielectric constant, the dielectric layer 13 may be directly formed on the compound semiconductor layer 11. For example, a dielectric material such as $HfO_xN_y$ and $HfSiO_xN_y$ having a sufficiently high dielectric constant such that it may be used as the dielectric layer 13 and including an oxynitride may function as both a diffusion barrier layer and a dielectric layer at the same time. In another example, $HfO_xN_y$ or $HfSiO_xN_y$ may be used to form a diffusion barrier layer, and the dielectric layer 13 may be formed on the diffusion barrier layer. In addition, $HfO_xN_y$ or $HfSiO_xN_y$ may be formed as the dielectric layer 13 on the nitride layer 11a shown in FIG. 3. In this case, it may be considered that the dielectric layer 13 and a diffusion barrier layer are formed of the same material and form a single layer.

In the above-described embodiments, an oxynitride having good interfacial characteristics, high dielectric constant, thermal stability, and dense film quality is used to form the diffusion barrier layer 12 between the compound semiconductor layer 11 and the dielectric layer 13, and thus oxidation of the interface between the compound semiconductor layer 11 and the dielectric layer 13 can be suppressed. Therefore, a group III or V element may be prevented from accumulating in the interface or diffusing into the dielectric layer 13, and generation of an oxide layer can be prevented. Therefore, the electrical characteristics of the compound semiconductor device 10 may be improved.

For example, with the semiconductor device of this invention, small sub-threshold swing (SS) may be possible in a field-effect transistor to obtain a high Ion/Ioff ratio. Furthermore, deterioration of the characteristics ($C_{acc}$) of a metal oxide semiconductor (MOS) capacitor in an accumulation region may be limited or avoided. Therefore, electron mobility in an interfacial region may not be reduced, and thus operating speed may be increased. In addition, off leakage current may be reduced to decrease power consumption.

Figure 4:
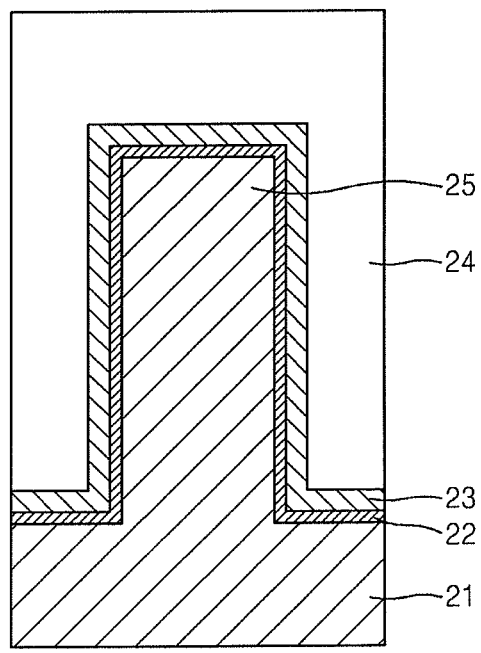
FIG. 4 is a schematic cross-sectional view illustrating an interfacial portion between a compound semiconductor layer and a dielectric layer of a compound semiconductor device according to another embodiment.
Figure 5:
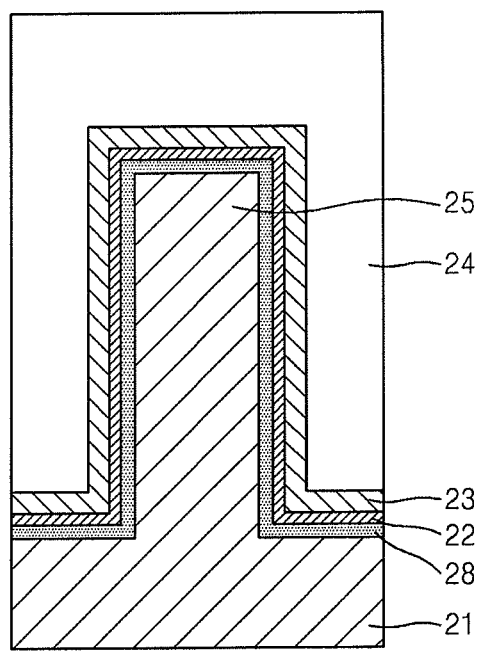
FIG. 5 is a schematic cross-sectional view illustrating an interfacial portion between a compound semiconductor layer and a dielectric layer of a compound semiconductor device according to another embodiment.
Figure 6:
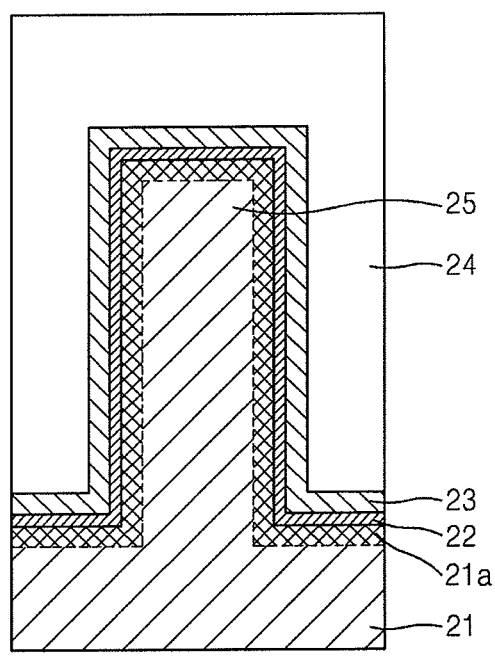
FIG. 6 is a schematic cross-sectional view illustrating an interfacial portion between a compound semiconductor layer and a dielectric layer of a compound semiconductor device according to another embodiment.

In the above description, the compound semiconductor layer 11, the diffusion barrier layer 12, and the dielectric layer 13 are formed in a generally planar semiconductor structure, i.e., a structure where the compound semiconductor layer 11, the diffusion barrier layer 12, the dielectric layer 13 and the passivation layer 18, if present, are all planar. However, the above-described embodiments may also be applied to semiconductor structures having various shapes. For example, FIGS. 4 to 6 illustrate examples in which the previous embodiments are applied to fin field effect transistors (FinFETs) having a fin shape so as to increase channel controllability per unit area. An interfacial portion between a compound semiconductor layer 21 having a shape and an associated dielectric layer 23 is schematically illustrated in FIGS. 4 to 6.

Referring to FIG. 4, a compound semiconductor layer 21 may include a channel region 25 protruding at a center region thereof. A diffusion barrier layer 22 and a dielectric layer 23 may cover the compound semiconductor layer 21 including the channel region 25, and an electrode 24 may be formed on the dielectric layer 23. Except for the sectional shapes, the materials and functions of the compound semiconductor layer 21, the diffusion barrier layer 22, and the dielectric layer 23 may be the same as those explained above with reference to FIGS. 1 to 3. For example, the diffusion barrier layer 22 may be formed of a material including an oxynitride.

Referring to FIG. 5, a passivation layer 28 formed using sulfur (S), nitrogen (N), fluorine (F), chlorine (Cl), or hydrogen (H) may be disposed between a compound semiconductor layer 21 and a diffusion barrier layer 22. Referring to FIG. 6, a nitride layer 21a may be formed by nitriding a surface of compound semiconductor layer 21 including a channel region 25.

The semiconductor device and the method of fabricating the semiconductor device have been described according to the exemplary embodiments with reference to the accompanying drawings. It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:
1. A semiconductor device comprising:
a compound semiconductor layer;
a dielectric layer; and
a diffusion barrier layer comprising an oxynitride layer formed between the compound semiconductor layer and the dielectric layer, and also
wherein the diffusion barrier layer further comprises a nitride layer formed on the compound semiconductor layer by nitriding a surface of the compound semiconductor layer.

2. The semiconductor device of claim 1, wherein the compound semiconductor layer comprises at least one element of groups III, V, and VI in the periodic table.

3. The semiconductor device of claim 1, wherein the diffusion barrier layer comprises at least one of $HfON_x$, $SiON_x$, $AlON_x$, $TiSiON_x$, $TaSiON_x$, $HfSiO_xN_y$, and $M_xO_yN_z$, where M denotes a transition metal or rare-earth metal.

4. The semiconductor device of claim 1, wherein the diffusion barrier layer has a thickness of about 10 nm or less.

5. The semiconductor device of claim 1, wherein the dielectric layer comprises at least one of $HfO_2$, $Al_2O_3$, $La_2O_3$, $ZrO_2$, HfSiO, HfSiON, HfLaO, LaAlO, and SrTiO.

6. The semiconductor device of claim 1, further comprising a passivation layer between the compound semiconductor layer and the diffusion barrier layer.

7. The semiconductor device of claim 6, wherein the passivation layer comprises at least one of sulfur (S), nitrogen (N), fluorine (F), chlorine (Cl), and hydrogen (H) formed on the compound semiconductor layer.

8. The semiconductor device of claim 1, wherein the diffusion barrier layer further comprises at least one of silicon nitride (SiN), aluminum nitride (AlN), and hafnium nitride (HfN) formed on the compound semiconductor layer.

9. The semiconductor device of claim 1, wherein the diffusion barrier layer and the dielectric layer comprise the same material.

10. The semiconductor device of claim 9, wherein the diffusion barrier layer and the dielectric layer comprise at least one of $HfO_xN_y$ and $HfSiO_xN_y$.

11. A method of fabricating a semiconductor device, the method comprising:
  forming a diffusion barrier layer comprising an oxynitride on a compound semiconductor layer; and
  forming a dielectric layer on the diffusion barrier layer, and also
  wherein the diffusion barrier layer further comprises a nitride layer formed on the compound semiconductor layer by nitriding a surface of the compound semiconductor layer.

12. The method of claim 11, wherein the compound semiconductor layer comprises at least one element of groups III, V, and VI in the periodic table.

13. The method of claim 11, wherein the diffusion barrier layer comprises at least one of $HfON_x$, $SiON_x$, $AlON_x$, $TiSiON_x$, $TaSiON_x$, $HfSiO_xN_y$, and $M_xO_yN_z$, where M denotes a transition metal or rare-earth metal.

14. The method of claim 13, wherein the diffusion barrier layer is formed by an ALD (atomic layer deposition) method, a CVD (chemical vapor deposition) method, and/or a sputtering method.

15. The method of claim 11, wherein the diffusion barrier layer further comprises at least one of SiN, AlN, and HfN, and after the step of forming of the dielectric layer, the method further comprises a step of performing a thermal annealing treatment.

16. The method of claim 11, wherein prior to the step of forming the diffusion barrier layer, the method comprises a step of forming a passivation layer on the compound semiconductor layer.

17. The method of claim 16, wherein the passivation layer comprises at least one of sulfur (S), nitrogen (N), fluorine (F), chlorine (Cl), and hydrogen (H) formed on the compound semiconductor layer.

18. The method of claim 11, wherein the diffusion barrier layer and the dielectric layer comprise the same material.

* * * * *